United States Patent
Geiger et al.

(10) Patent No.: US 12,362,241 B2
(45) Date of Patent: Jul. 15, 2025

(54) SEMICONDUCTOR STRUCTURE AND METHOD FOR FORMING A SEMICONDUCTOR STRUCTURE

(71) Applicant: Intel Corporation, Santa Clara, CA (US)

(72) Inventors: Richard Geiger, Munich (DE); Klaus Herold, Munich (DE); Harald Gossner, Riemerling (DE); Martin Ostermayr, Woerth (DE); Georgios Panagopoulos, Munich (DE); Johannes Rauh, Kirchseeon (DE); Joachim Singer, Neubiberg (DE); Thomas Wagner, Regelsbach (DE)

(73) Assignee: Intel corporation, Santa Clara, CA (US)

( * ) Notice: Subject to any disclaimer, the term of this patent is extended or adjusted under 35 U.S.C. 154(b) by 698 days.

(21) Appl. No.: 17/644,801

(22) Filed: Dec. 17, 2021

(65) Prior Publication Data

US 2023/0197537 A1    Jun. 22, 2023

(51) Int. Cl.
   *H01L 23/58*    (2006.01)
   *H01L 21/66*    (2006.01)
   *H01L 23/48*    (2006.01)
   *H01L 29/10*    (2006.01)

(52) U.S. Cl.
   CPC .......... *H01L 22/32* (2013.01); *H01L 23/481* (2013.01)

(58) Field of Classification Search
   CPC ............... H01L 22/32; H01L 23/481; H01L 2225/06541; H01L 22/14; H01L 22/34; H01L 24/13; H01L 2225/06596; H01L 25/18; H01L 2224/0401; H01L 23/49827; H01L 23/528; H01L 2224/13025; H01L 21/76895; H01L 2224/1308; H01L 24/11; H01L 25/50; H01L 2224/06181; H01L 2221/68372; H01L 2224/05096; H01L 2224/16146; H01L 2225/06524; H01L 2225/06548; H01L 23/5226; H01L 23/5384; H01L 24/08; H01L 24/09; H01L 2224/08145; H01L 2224/13022; H01L 2224/1403; H01L 2224/73203; H01L 2225/06586; H01L 2224/16235; H01L 2224/32145; H01L 23/12; H01L 2224/92144; H01L 2224/92244; H01L 23/525; H01L 24/82; H01L 2924/15153; H01L 21/486; H01L 2224/0392; H01L 2224/05093; H01L 2224/13021; H01L 2224/02372
   See application file for complete search history.

(56) References Cited

U.S. PATENT DOCUMENTS

2013/0342231 A1*  12/2013  Alfano .................. H05K 1/0268
                                                     324/750.16
2015/0228547 A1*   8/2015  Shih ........................ H01L 22/30
                                                            257/48

* cited by examiner

*Primary Examiner* — Niki H Nguyen
(74) *Attorney, Agent, or Firm* — SPL Patent Attorneys PartG mbB; Kieran O'Leary

(57) ABSTRACT

A semiconductor structure is provided. The semiconductor structure includes a plurality of transistors arranged at a front side of a semiconductor substrate and a test structure located at the front side of the semiconductor substrate. Further, the semiconductor structure comprises a first electrically conductive connection extending from the test structure through the semiconductor substrate to a backside test pad arranged at a backside of the semiconductor substrate.

24 Claims, 9 Drawing Sheets

SEMICONDUCTOR STRUCTURE AND METHOD FOR FORMING A SEMICONDUCTOR STRUCTURE

BACKGROUND

With scaling of advanced semiconductor technology, process variation becomes an increasingly important topic. To monitor such variations, monitoring structures are routinely placed either within a scribe line or within a design. As the number of process steps increases with more advanced process nodes, there is a similar increase in parameters to track which increases complexity and the area required for placement of test structures. Thus, there may be a need to improve a semiconductor structure.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further, examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of the group A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
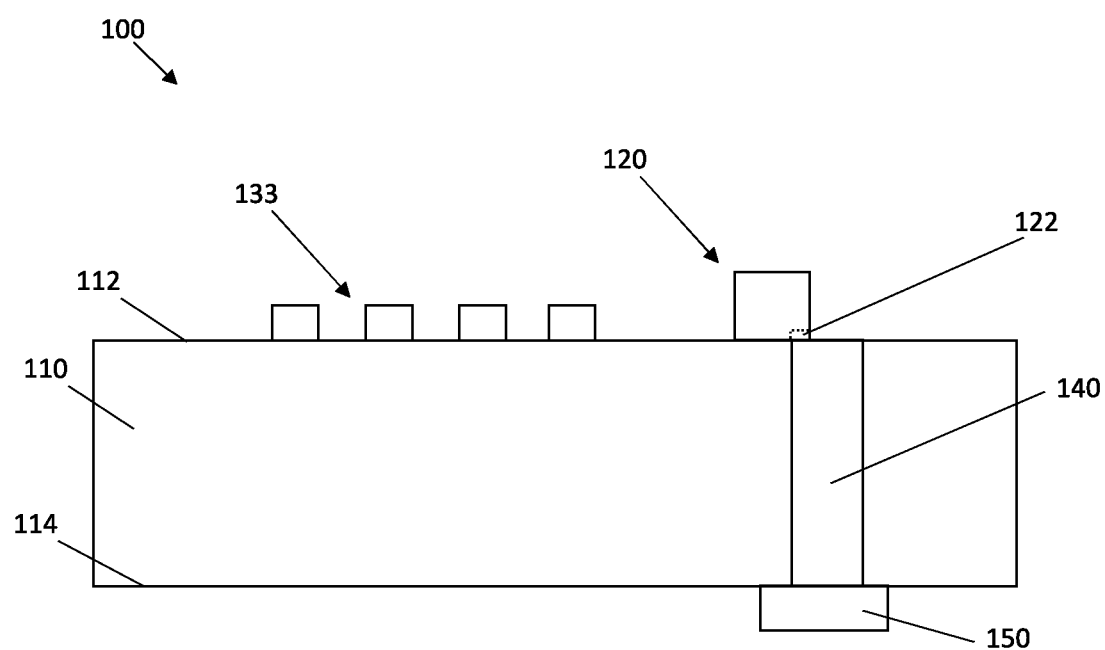
FIG. 1 shows a cross-sectional view of an example of a semiconductor structure.

FIG. 1 shows a cross-sectional view of an example of a semiconductor structure 100. The semiconductor structure 100 comprises a plurality of transistors 133 arranged at a front side 112 of a semiconductor substrate 110 and a test structure 120 located at the front side 112 of the semiconductor substrate 110. Optionally, the test structure 120 comprises a first terminal 122. Further, the semiconductor structure 100 comprises a (first) electrically conductive connection 140 extending from the test structure 120 through the semiconductor substrate 110 to a backside test pad 150 arranged at a backside 114 of the semiconductor substrate 110. For example, the first electrically conductive connection may extend from the first terminal 122 through the semiconductor substrate 110 to the backside test pad 150. This way, the test structure 120 can be accessed for testing purposes from the backside 114 of the semiconductor substrate 110. Thus, a monitoring/testing via a wiring from a terminal 122 of the test structure 120 through a back-end-of-line (BEOL) stack up to test pads at a top metal layer can be omitted, which may improve a monitoring/testing of the semiconductor structure 100, e.g., the test structure 120.

Further, a monitoring/testing at a lower metal level can be improved. For example, a semiconductor wafer comprising the semiconductor structure 100 may be taken out of a process line before completion of a manufacturing. For a post silicon debug a need to connect an external test probe tip to a signal line, which has a width of less than 15 nm, can be omitted by connecting the external test probe tip to the backside test pad 150, which has a larger lateral dimension. Thus, a contacting of the test structure 120 can be improved by arranging the backside test pad 150 and contacting the backside test pad 150 for monitoring/testing. For example, the first electrically conductive connection 140 may comprise the signal line. Thus, the signal line can be contacted via contacting the backside test pad 150 (which is electrically connected to the first electrically conductive connection 140), which may ease a connection to the signal line.

Further, in case of monitoring/testing a device at a lower metal level, additional dedicated test structures may be needed as a frontside test pad needs to be transferred into the lower metal level and routing has to be adjusted to the reduced available BEOL, which may increase a required area for monitoring/testing. Furthermore, dedicated lots may have to be run to process those short-loop wafers where any structures designed for full-loop processing may be non-functional, which may increase feedback time and development costs.

Moreover, the layout may need to reserve an additional area to allow the post silicon debug to access the signal line. Arranging a backside test pad 150 at the backside 114 of the semiconductor substrate 110 may avoid one or more of these efforts.

The semiconductor substrate 110 may comprise or may be composed of any type of substrate. For example, the semiconductor substrate 110 may comprise or may be composed of a single crystal of a material which may include, but is not limited to, silicon, germanium, silicon-germanium, germanium-tin, silicon-germanium-tin, or a group III-V compound semiconductor material. The semiconductor substrate 110 may be a bulk substrate or may be part of a semiconductor-on-insulator (SOI) substrate. In an example, a thickness of the semiconductor substrate 120 may be at most 500 μm, or at most 400 μm, or at most 300 μm, or at most 200 μm, or at most 100 μm, or at most 50 μm, or at most 10 μm, or at most 1 μm.

The test structure 120 may comprise or may be any kind of an electronic circuitry, a part of an electronic circuitry, a metal layer, etc. For example, the test structure 120 can be independent from any circuitry implementing a functionality of the semiconductor die of a semiconductor wafer. For example, the test structure 120 can solely be used for testing and might not be used or accessible after completion of manufacturing (e.g., a full manufacturing process run is finished). The test structure 120 may be destroyed during the manufacturing, e.g., by a singulation of semiconductor dies, e.g., using a dicing process.

The first electrically conductive connection 140 may comprise or may be made of any appropriate conductive material, such as copper, silver, nickel, gold, aluminum, other metals or alloys, or combinations of materials, for example. Different parts of the first electrically conductive connection 140 may comprise or may be made of different materials.

In an example, the first electrically conductive connection 140 may comprise at least a part of a buried line arranged in a trench extending into the semiconductor substrate 110. For example, the first electrically conductive connection 140 may be an electrically conductive line or may comprise an electrically conductive line, e.g., the buried line. The electrically conductive line may run laterally in a trench, which extends vertically into the semiconductor substrate 110. The top surface of the electrically conductive line may be coplanar with a frontside surface of the semiconductor substrate 110 or may protrude from the frontside surface of the semiconductor substrate 110. The top surface of the electrically conductive line may be contacted by one or more vias and/or one or more contact structures (e.g., comprised by a front-end-of-line layer) to the first terminal 122. The electrically conductive line may extend to the backside 114 of the semiconductor substrate 110 (e.g., if the semiconductor substrate 110 is thin). In this case, the bottom surface of the first electrically conductive connection 140 may be the bottom surface of the electrically conductive line. In this way, a connection from the front side 112 to the backside 114 of the semiconductor substrate 110 may be implemented with low effort, since the number of necessary process steps may be kept low.

The electrically conductive line (e.g., the buried line) may have a minimal lateral dimension of the bottom surface of at most 300 nm (or at most 240 nm or at most 180 nm) and/or at least 30 nm (or at least 60 nm or at least 80 nm). The electrically conductive line may have a vertical dimension extending into the semiconductor substrate 110 of at most 5 μm (or at most 3 μm or at most 1 μm) and/or at least 200 nm (or at least 500 nm or at least 800 nm).

For example, a part of the electrically conductive connection 140 (electrically conductive line, e.g. at least a part of a buried line) may be formed with the same process used for forming a buried supply line (e.g., a buried power rail) for powering an active electronic circuitry, e.g., the plurality of transistors 133, which are formed at the front side 112 of the semiconductor substrate 110 of the semiconductor structure 100, e.g. a semiconductor wafer. A buried power rail (BPR) may be an electrically conductive line extending into the semiconductor substrate, which is used to supply one or more transistors, for example. For example, the part of the electrically conductive connection 140 electrically conductive line may have an equal vertical dimension as a BPR electrically conductive line.

In an example, the first electrically conductive connection 140 may comprise a through semiconductor via (TSV) extending from the backside 114 of the semiconductor substrate 110 to the buried line. For example, the through semiconductor via may be connected to the electrically conductive line (e.g. if a thickness of the semiconductor substrate 110 is larger than a depth of the buried line). For example, the through semiconductor via may extend from a bottom surface of the electrically conductive line to the backside 114 of the semiconductor substrate 110. In this case, the bottom surface of the first electrically conductive connection 140 may be the bottom surface of the through semiconductor via. In an example, the through semiconductor via may be a through silicon via (e.g. a μTSV). The through semiconductor via of the first electrically conductive connection 140 may have a maximal width of less than 5 μm (or less than 2 μm or less than 700 nm).

In an example, the first electrically conductive connection 140 may comprise a portion located in a front-end-of-line layer located on top of the semiconductor substrate 110. This way an electrically connection between the backside test pad 150 and the first terminal 122 can be formed in an improved way. For example, the front-end-of-line layer may be a formed conductive structure nearest to the front side 112 of the semiconductor substrate 110. For example, the front-end-of-line layer may be an engaged layer of the plurality of transistors formed in the front side 112 of the semiconductor substrate 110. The portion located in the front-end-of-line layer may comprise or may be made of the same material as a gate of a transistor (e.g., a transistor of the plurality of transistors 133) formed at the front side 112 of the semiconductor substrate 110, for example. The portion located in the front-end-of-line layer may comprise at least one of polysilicon, tungsten, nickel silicide, cobalt or aluminum.

In an example, the semiconductor structure 100 may be a semiconductor wafer or a semiconductor die. The semiconductor die 110 may be a processor die (e.g. a Central Processing Unit (CPU) die, a Graphics Processing Unit (GPU) die, a microcontroller die or a Digital Signal Processor (DSP) die), a memory die, a Micro-Electro-Mechanical System (MEMS) die, a transceiver die or any other semiconductor die. For example, the test structure 120 may be used during a manufacturing of the semiconductor die to monitor a specific process of the manufacturing. For example, the test structure 120 might not be used or be accessible after completion of manufacturing. Thus, the test structure 120 may only be used for a certain period during the manufacturing of a semiconductor die and not after fully finishing the manufacturing. For example, as long as the test structure 120 can be used for monitoring/testing a processing of the plurality of transistor 133 may not be finished, e.g., a part of BEOL may be missing.

In an example, the semiconductor structure 100 may be a semiconductor wafer. In this case, the test structure 120 may be located in a kerf region of the semiconductor wafer. For example, the kerf region may be a region for dicing the semiconductor wafer during a singulation. Thus, the test structure 120 may be only functional as long as a manufacturing of the plurality of semiconductor dies is not finished. For example, the test structure 120 might not be used or accessible after completion a manufacturing of the plurality of semiconductor dies, e.g., a singulation has been performed.

The backside test pad 150 has a size large enough to be contacted with an external test probe tip of a test apparatus. In an example, a maximal dimension of the backside test pad 150 may be at most 100 µm (or at most 80 µm or at most 60 µm) and/or at least 10 µm (or at least 20 µm or at least 30 µm). Thus, a contacting at a lower metal level can be improved, e.g., a contacting of a small signal line can be omitted.

In an example, the test structure 120 may comprise at least one element of the group of a transistor, a resistor, a diode, a capacitor, a metal layer and a via. For example, the test structure 120 can be any structure, which may be formed by a single process or by a plurality of processes. This way, each process of a manufacturing can be monitored. Thus, a cause of a failure in a manufacturing process can be determined to a specific process of the manufacturing.

In an example, the test structure 120 may further comprise a second terminal. A second electrically conductive connection may extend from the second terminal to a front side test pad arranged at the front side 112 of the semiconductor substrate 110. Thus, a two-terminal sensing using the backside test pad 150 and the front side test pad can be performed.

In general, a test structure 120 for monitoring (e.g., to extract required data) may be small compared to the test pads used for monitoring, e.g., the front side test pad or the backside test pad 150. Thus, for using a plurality of test pads located either at a frontside 112 or a backside 114 of the semiconductor substrate 110, an achievable minimum test pad pitch may define an area needed for performing a monitoring. Locating two different test pads, the backside test pad 150 and the front side test pad, at different (opposing) sides of the semiconductor substrate 110 can significantly decrease the area needed for monitoring. Thus, an area saving can be achieved, which may allow forming an increased number of test structures 120 and/or functional electronic circuitries (e.g., an increased number of transistor of the plurality of transistors 133) after completion of a manufacturing.

For example, the test structure 120 may be a transistor. In this case, the first terminal 122 can be a source of the transistor and the second terminal can be a drain of the transistor.

Thus, the transistor can be monitored/tested by use of front side test pad and the backside test pad 150.

In an example, the semiconductor structure 100 may further comprise a third electrically conductive connection extending from the first terminal 122 to a further front side test pad arranged at the front side 112 of the semiconductor substrate 100. Alternatively, the third electrically conductive connection may extend from a third terminal of the test structure 120 to the further front side test pad. For example, the test structure 120 may be a transistor and the third terminal may be a gate of the transistor. Thus, electrical properties of the transistor can be measured in an improved way using the backside test pad 150, the front side test pad and the further front side test pad.

In an example, the semiconductor structure 100 may further comprise a fourth electrically conductive connection extending from the second terminal through the semiconductor substrate 110 to a further backside test pad arranged at the backside 114 of the semiconductor substrate 110. Alternatively, the fourth electrically conductive connection may extend from a third terminal of the test structure 120 to the further backside test pad (e.g., if no third electrically conductive connection is comprised by the semiconductor structure 100). For example, the test structure 120 may be a transistor and the third terminal may be a gate of the transistor. Thus, electrical properties of the transistor can be measured in an improved way using the backside test pad 150, the front side test pad and the further backside test pad.

A plurality of backside test pads and a plurality of front side test pads different information of the test structure 120 comprising information about the respective electrically conductive connection can be obtained. Thus, an effect on the monitoring caused by a respective electrically conductive connection can be determined, e.g., by comparing monitoring data obtained by the plurality of backside test pads (e.g., comprising information about a BEOL process) with monitoring data obtained by the plurality of front side test pads (e.g., comprising information about a FEOL process). This way, an accuracy of a determined electronic characteristic of the test structure 120 can be improved. Further, a plurality of backside test pads and a plurality of front side test pads may allow an improved four-terminal sensing of the test structure 120.

In an example, the semiconductor structure 100 may further comprise a further test structure arranged at the front side 112 of the semiconductor substrate 110. The further test structure may comprise a first terminal. Further, the semiconductor structure 100 may comprise a second electrically conductive connection extending from the first terminal of the further test structure to a front side test pad arranged at the front side 112 of the semiconductor substrate 110. This way, different test structures can be formed, especially laterally overlapping test structures, which can decrease an area needed for forming a plurality of test structures of the semiconductor structure 100. Thus, an area needed for monitoring can be decreased and/or a number of test structures can be increased.

In an example, the second electrically conductive connection may comprise a portion located in a front side wiring layer stack formed on the front side 112 of the semiconductor substrate 110, e.g., a via or a wiring line.

The front side wiring layer stack may comprise lateral wiring layers for lateral wiring connections and vertical wiring layers for vertical wiring connections. For example, the vertical wiring connections may comprise the second electrically conductive connection or a main portion of the second electrically conductive connection. A lateral wiring layer (e.g., a metal layer) may be a layer for implementing lateral electrical connections (e.g., a wiring line) between vertical electrical connections (e.g., vias). A vertical wiring layer (e.g. via layer) may be a layer for implementing vertical electrical connections (e.g., a via) between lateral electrical connections, e.g. the front test pad and the second terminal.

For example, the portion of the second electrically conductive connection located in the front side wiring layer stack may be at least a part of a via or at least a part of a wiring line. For example, the second electrically conductive connection may comprise mainly (e.g., more than 50%) copper, aluminum, tungsten, gold or an alloy comprising mainly copper, aluminum, tungsten, gold and/or the second electrically conductive connection or portions of the second electrically conductive connection may be made of copper structures, aluminum structures, tungsten structures or gold structures.

In an example, the front side test pad may laterally overlap with the backside test pad 150. Thus, an area for locating a plurality of test pads can be decreased, which may improve a monitoring process, e.g. by an increased number of test pads. For example, from a top view the front side test pad may overlap the backside test pad 150.

By electrically connecting test pads on both, the front side 112 and the backside 114 of the semiconductor substrate 110 or by overlapping test pads (e.g., the backside test pad 150 and the front side test pad) and individually connecting the test pads to the test structure 120 from a backside 114 and a further test structure from a front side 112 of a semiconductor substrate 110, respectively, an area needed for monitoring can be significantly decreased and/or a placement of more test structures on the same area (footprint) can be achieved, resulting in a possible more extensive monitoring data set. Furthermore, added versatility in monitoring may offer faster turn-around times.

In an example, the further test structure may further comprise a second terminal. Further, the semiconductor structure 100 may comprise a third electrically conductive connection extending from the second terminal of the further test structure to a further front side test pad arranged at the front side 112 of the semiconductor substrate 110. Thus, a monitoring of the further test structure can be improved.

In an example, the third electrically conductive connection may comprise a portion located in a front side wiring layer stack formed on the front side 112 of the semiconductor substrate 110. For example, a front side wiring layer stack may comprise the third electrically conductive connection, e.g., as described above with reference to the second electrically conductive connection. For example, a front side wiring layer stack may comprise the portion of the second electrically conductive connection and the portion of the third electrically conductive connection.

For example, the portion of the third electrically conductive connection located in the front side wiring layer stack may be at least a part of a via or at least a part of a wiring line, e.g., as described above with reference to the second electrically conductive connection. For example, the second electrically conductive connection may comprise mainly (e.g., more than 50%) copper, aluminum, tungsten, gold or an alloy comprising mainly copper, aluminum, tungsten, gold and/or the second electrically conductive connection or portions of the second electrically conductive connection may be made of copper structures, aluminum structures, tungsten structures or gold structures.

In an example, the test structure 120 may further comprise a second terminal. Further, the semiconductor structure 100 may comprise a fourth electrically conductive connection extending from the second terminal of the test structure 120 through the semiconductor substrate 110 to a further backside test pad arranged at the backside 114 of the semiconductor substrate 110. Thus, the monitoring of the test structure 120 can be improved.

The further backside test pad has a size large enough to be contacted with an external test probe tip of a test apparatus. In an example, a maximal dimension of the further backside test pad may be at most 100 μm (or at most 80 μm or at most 60 μm) and/or at least 10 μm (or at least 20 μm or at least 30 μm).

In an example, the fourth electrically conductive connection may comprise at least a part of a buried line arranged in a trench extending into the semiconductor substrate 110. The fourth electrically conductive connection may comprise or may be made of any appropriate conductive material, such as copper, silver, nickel, gold, aluminum, other metals or alloys, or combinations of materials, for example.

In an example, the fourth electrically conductive connection may comprise at least a part of a buried line arranged in a trench extending into the semiconductor substrate 110. For example, the fourth electrically conductive connection may be an electrically conductive line or may comprise an electrically conductive line, e.g., the buried line, e.g., as described above with reference to the first electrically conductive connection 140. For example, the fourth electrically conductive connection may be formed with the first electrically conductive connection 140, e.g., simultaneously with the first electrically conductive connection 140 (and optional with further formed BPRs).

In an example, the fourth electrically conductive connection may comprise a through semiconductor via extending from the backside 114 of the semiconductor substrate 110 to the buried line. For example, the through semiconductor via may be a through semiconductor via as described above with reference to the first electrically conductive connection 140.

In an example, the fourth electrically conductive connection may comprise a portion located in a front-end-of-line layer located on top of the semiconductor substrate 110. This way an electrically connection between the further backside test pad and the second terminal can be formed in an improved way. For example, a front-end-of-line layer as described above with reference to the first electrically conductive connection 140 may comprise the portion of the fourth electrically conductive connection. For example, a front-end-of-line layer may comprise both, the portion of the first electrically conductive connection 140 and the portion of the fourth electrically conductive connection.

For example, by forming the first electrically conductive connection and optionally the fourth electrically conductive connection with the same process(es) used for forming a BPR contacting of the test structure 120/the further test structure can be improved. For example, a BPR may be formed to enable a connection from the backside 114 of the semiconductor substrate 110 to an electronic circuitry, e.g., a transistor, especially by use of a μTSV. Thus, by forming the first electrically conductive connection and optionally the fourth electrically conductive connection simultaneously to the BPRs (and optionally μTSVs) a manufacturing can be eased. Further, by locating the backside test pad 150 at a backside 114 of the semiconductor substrate 110 and the front side test pad at a front side 112 of the semiconductor substrate 110 a drastic reduction in required silicon area can be achieved. Further, increased options and increased flexibility in a manufacturing and a speed monitoring can be achieved.

For example, by utilizing a process for forming BPRs (and optionally μTSVs) to form simultaneously the first electrically conductive connection and optionally the fourth electrically conductive connection the possibility to access a test structure 120 from a backside 114 of the semiconductor substrate 110, e.g., via a μTSV, may provide additional freedom in how to wire signals. This can be used for improving how monitoring structures, like the test structure 120 are monitored, e.g., from a backside 114 or from a backside 114 and from a front side 112 of the semiconductor substrate 110. The combination of wiring to the front side 112 and the backside 114 of the semiconductor substrate 110 can be used, e.g., to reduce a needed area for a plurality of test pads, increase a number of test pads on a same area, compare monitoring data obtained using different wirings, e.g., the first 140/fourth electrically conductive connection for the back side test pads 150 and the second/third electrically conductive connection for the front side test pads, etc. By forming the first 140/fourth electrically conductive connection with the same process as BPRs no further processes may be required.

For example, with the first 140/second/third/fourth electrically conductive connection, signal lines for test structure monitoring/testing can be routed either to the front side 112 (second/third electrically conductive connection) or to the backside 114 (first 140/fourth electrically conductive connection) of the semiconductor substrate 110. Combining those two options may greatly enhance a possibilities to design more compact and more versatile monitoring structures without any process change.

In an example, the further front side test pad may laterally overlap with the further backside test pad.

In an example, a wiring layer stack may comprise an intermediate layer. Test structure 120 and all backside test pads 150 connected to the test structure 120 may be located at a first side of the intermediate layer. The further test structure and all front side test pads connected to the further test structure may be located at a second, opposite side of the intermediate layer. Thus, the intermediate layer may separate the test structure 120 from the further test structure. This way, both test structures can be monitored independently. For example, the wiring layer stack may be the front side wiring layer stack, which may comprise the portion of the second electrically conductive connection and/or the portion of the third electrically conductive connection.

More details and aspects are mentioned in connection with the examples described below. The example shown in FIG. 1 may comprise one or more optional additional features corresponding to one or more aspects mentioned in connection with the proposed concept or one or more examples described below (e.g., FIG. 2-7).

Figure 2:
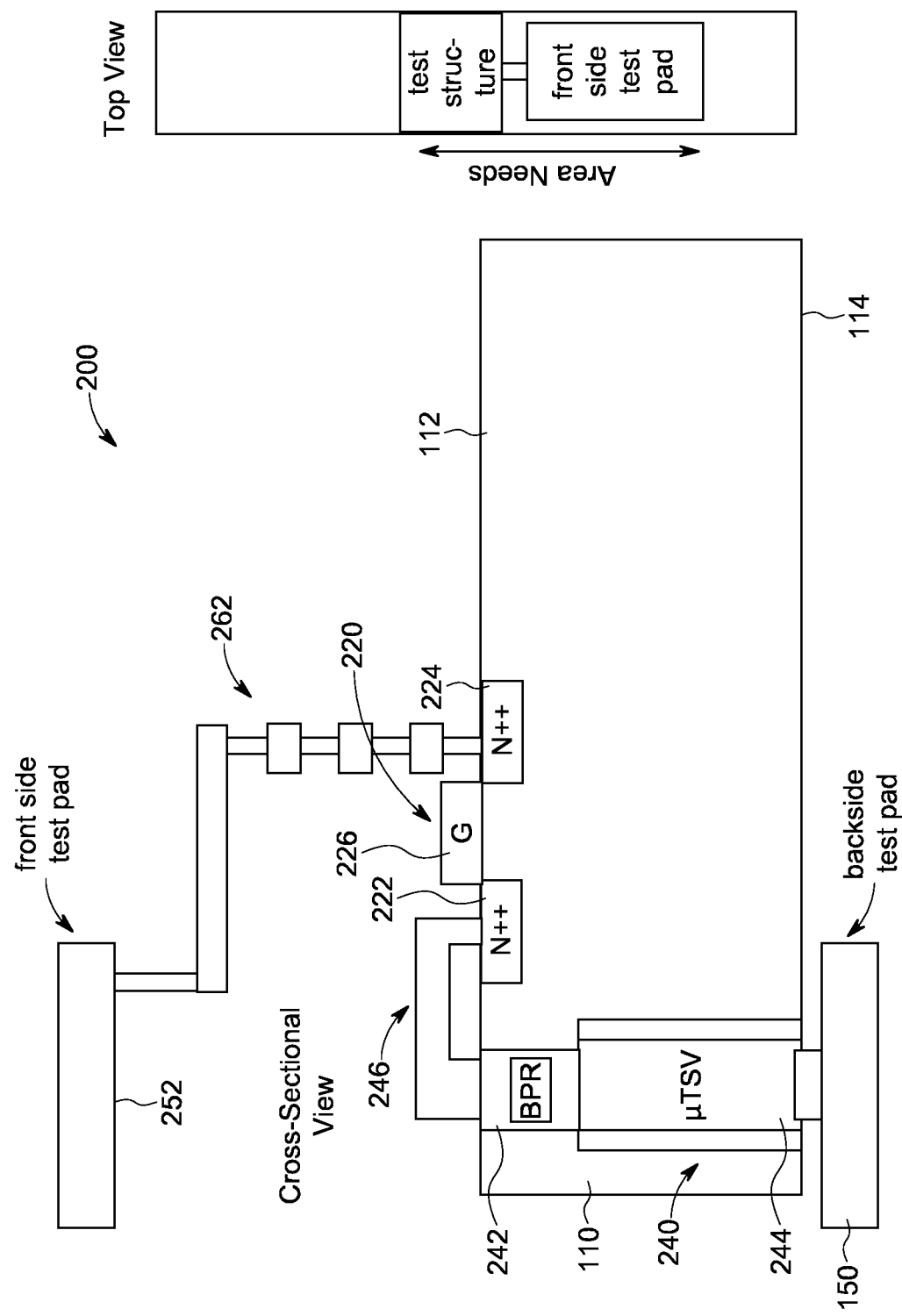
FIG. 2 shows a cross-sectional view and a top view of another example of a semiconductor structure.

FIG. 2 shows a cross-sectional view and a top view of another example of a semiconductor structure 200. The semiconductor structure 200 comprises a plurality of transistors (not shown) located at a front side 112 of the semiconductor substrate 110. Further, the semiconductor structure 200 comprises a test structure 220, which may comprise a first terminal 222 and a second terminal 224. Further, the semiconductor structure 200 comprises a first electrically conductive connection 240 extending from the first terminal 222 to a backside test pad 150. For example, the first electrically conductive connection 240 may comprise a BPR 242 and a μTSV 244. Further, the first electrically conductive connection 240 may comprise a portion located in a front-end-of-line layer 246 located on top of the semiconductor substrate 110. Thus, the backside test pad 150 may be electrically connected to the first terminal 222 by the μTSV 244, the BPR 242 and the front-end-of-line layer 246. This way, the first electrically conductive connection 240 can be formed simultaneously to/with a process for forming a functional electronic circuitry, e.g., a transistor, which may decrease an effort for forming/contacting the first electrically conductive connection 240.

A front side test pad 252 may be electrically connected by a second electrically conductive connection to the second terminal 224. For example, a portion of the second electrically conductive connection may be located in a front side wiring layer stack 262. This way, the second electrically conductive connection can be formed simultaneously to/with a process for forming a functional front side wiring layer stack 262, which may decrease an effort for forming/contacting the second electrically conductive connection.

For example, the test structure 220 may be a single device (e.g., a transistor) or a small circuit block. Thus, an area needed to place such a semiconductor structure 200 may be, therefore, not determined by the size of the single device or the circuit block under test, but rather by the minimum pitch of the test pads. By leveraging the possibility for back sided test pads, the test pads can be distributed between the front side 112 and the backside 114 of the semiconductor substrate 110, which may significantly reduce the footprint, e.g., an area needed at the semiconductor substrate 110 for forming the semiconductor structure 200 comprising a plurality of test pads 150, 252.

By locating the front side test pad 252 such that it laterally overlaps (overlaps from a top view) with the backside test pad 150 an area needed for locating a plurality of test pads 150, 252 can be decreased. Thus, a number of test pads 150, 252 can be increased, which may increase a monitoring data set, and/or a number of, e.g., transistors formed at the front side 112 of the semiconductor substrate 110.

For example, a further front side test pad or a further backside test pad can be connected to a third terminal 226 of the test structure 220. For example, the test structure 220 may be a transistor 220. The first terminal 222 may be a source of the transistor 220, the second terminal 224 may be a drain of the transistor 220 and the third terminal 226 may be a gate of the transistor 220. Thus, a monitoring of the transistor 220 can be performed in an improved way.

More details and aspects are mentioned in connection with the examples described above and/or below. The example shown in FIG. 2 may comprise one or more optional additional features corresponding to one or more aspects mentioned in connection with the proposed concept or one or more examples describe above (e.g., FIG. 1) and/or below (e.g., FIG. 3-7).

Figure 3:
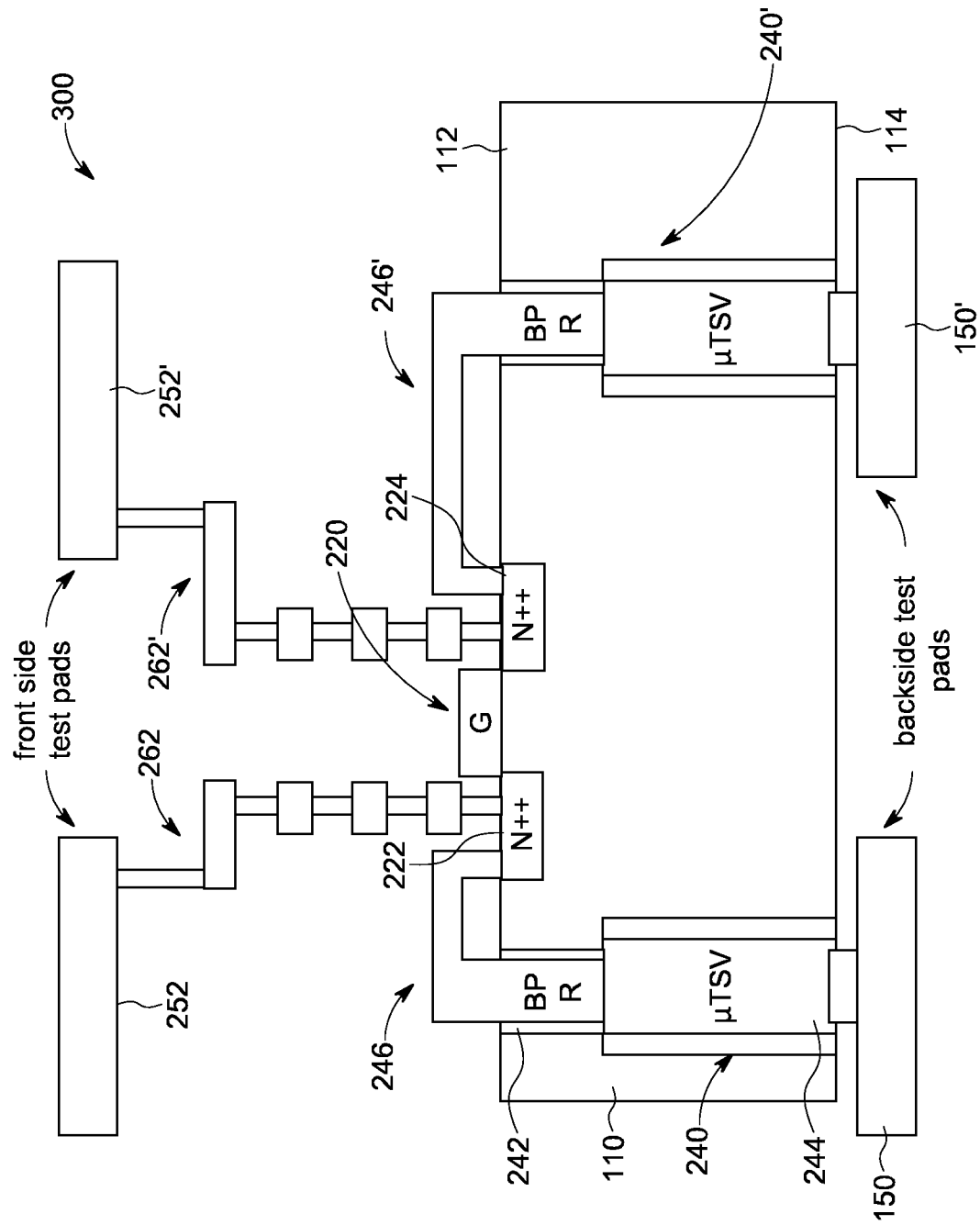
FIG. 3 shows a cross-sectional view of another example of a semiconductor structure.

FIG. 3 shows a cross-sectional view of another example of a semiconductor structure 300. The semiconductor structure 300 comprises a plurality of transistors (not shown) located at a front side 112 of the semiconductor substrate 110. Further, the semiconductor structure 300 comprises a test structure 220, which may comprise a first terminal 222 and a second terminal 224. Further, the semiconductor structure 300 comprises a first electrically conductive connection 240 and a fourth electrically conductive connection 240' extending from the first terminal 222 or the second terminal 224 to a backside test pad 150 or a further backside test pad 150', respectively. For example, the first electrically conductive connection 240 may comprise a BPR 242 and a μTSV 244. For example, the fourth electrically conductive connection 240' may comprise a BPR and a μTSV. Further, the first electrically conductive connection 240 and/or the fourth electrically conductive connection 240' may comprise a portion located in a front-end-of-line layer 246/246' located on top of the semiconductor substrate 110. For example, the first electrically conductive connection 240 and the fourth electrically conductive connection 240' may be formed by the same process, e.g., by the process(es) for forming the BPR 242, the μTSV 244 and the front-end-of-line layer 246/246'. For example, the front-end-of-line layer 246 and the front-end-of-line layer 246' may be the same front-end-of-line layer formed by one process. Alternatively, the front-end-of-line layer 246 and the front-end-of-line layer 246' may be formed by different processes.

A front side test pad 252 may be electrically connected by a second electrically conductive connection to the first terminal 222. A further front side test pad 252' may be electrically connected by a third electrically conductive connection to the second terminal 224. For example, the second electrically conductive connection and the third electrically conductive connection 240' may be formed by the same process, e.g., by a process(es) for forming the front side wiring layer stack 262/262'. For example, a portion of the second electrically conductive connection may be located in the front side wiring layer stack 262. For example, a portion of the third electrically conductive connection may be located in the front side wiring layer stack 262'. This way, the second/third electrically conductive connection can be formed simultaneously to/with a process for forming a functional front side wiring layer stack 262/262', which may decrease an effort for forming/contacting the second electrically conductive connection. For example, the front side wiring layer stack 262 and the front side wiring layer stack 262' may be the same front side wiring layer stack formed by one process. Alternatively, the front side wiring layer stack 262 and the front side wiring layer stack 262' may be formed by different processes.

As can be seen in FIG. 3 a monitoring/testing of the test structure 220 may be performed through the front side electrically conductive connections (the second electrically conductive connection and the third electrically conductive connection) and through the backside electrically conductive connections (the first electrically conductive connection 240 and the fourth electrically conductive connection 240'). For this purpose FIG. 3 shows an arbitrary two terminal 222, 224 semiconductor structure 300, e.g., a monitoring structure 300. A lowest feature of the test structure 220 may be part of the FEOL, e.g. a part of the front-end-of-line layer 246/246'. To monitor/test such a test structure 220 the front side test pad 252/252' can be placed in the highest metal layer to allow contacting with external probe tips and the signal may be brought to the FEOL contact by connecting through all metals layer and vias in the BEOL stack, e.g., the front side wiring layer stack 262/262'.

Further, the backside test pad 150/150' can be used to monitor/test the test structure 220. For this, electrically conductive connections (the first electrically conductive connection 240 and the fourth electrically conductive connection 240') may comprise a BPR 242 with μTSV 244 to create an (additional) access to the test structure 220 from an opposing side of the semiconductor substrate 110. For example, the electrically conductive connections may comprise a portion located in a front-end-of-line layer 246/246', which may be contacted directly to the BPR 242. This allows direct monitoring/testing of the test structure 220 at different access planes, from the front side 112 and from the backside 114 of the semiconductor substrate 110. Thus, it may provide additional information about a specific process of the manufacturing, as the test structure 220 can, e.g., be monitored/tested from the front side test pads 252/252' (giving information about the front side wiring layer stack 262/262', e.g., through the full BEOL used to electrically contact the transistor located at the semiconductor substrate 110), while the backside test pads 150/150' bypasses the BEOL including the lowest metal layers. Thus, especially failures in the lowest metal layers, which may be most critical in terms of lithography, can be determined. Further, information about a contact via the (low-resistance) wiring structure comprising the portion of the front-end-of-line layer 246/246', the BPR 242 and the μTSV 244 can be achieved.

Furthermore, the use of the backside test pads 150/150' may allow to measure the test structure 220 even without a full BEOL being processed, e.g. without the front side wiring layer stack 262/262'. Further, by use of the backside test pads 150/150' a short-loop wafer may require no additional test structures with dedicated test pads on the last processed metal layer. Thus, measurements can be done either on short-loop or on full-loop test structures. By utilizing the backside test pads 150/150' easy access to the test structure 220 can be achieved for several BEOL access points, even from the same semiconductor substrate 110 and an identical test structure 220 after a full BEOL processing.

Further, the backside test pads 150/150' can provide a quick access to critical signals for post silicon debug purposes. Post silicon debug may be done from the backside 114 of the semiconductor substrate 110 via FIB (focused ion beam) edits. FIB requires very accurate navigation to the signal lines (e.g., lines width below 15 nm). Locating a backside test pad 150/150' at the backside 140 of the semiconductor substrate 110 may significantly reduce a complexity in navigation, since a lateral dimension of the backside test pad 150/150' may be much larger than the line width of the signal lines.

Further, by arranging the backside test pads 150/150' at the backside 114 of the semiconductor substrate 110 and the front side test pads 252/252' at the front side 112 of the semiconductor substrate 110 a four-terminal sensing can be performed. This way, an applicability of a four-terminal sensing can be increased.

More details and aspects are mentioned in connection with the examples described above and/or below. The example shown in FIG. 3 may comprise one or more optional additional features corresponding to one or more aspects mentioned in connection with the proposed concept or one or more examples describe above (e.g., FIG. 1-2) and/or below (e.g., FIG. 4-7).

Figure 4:
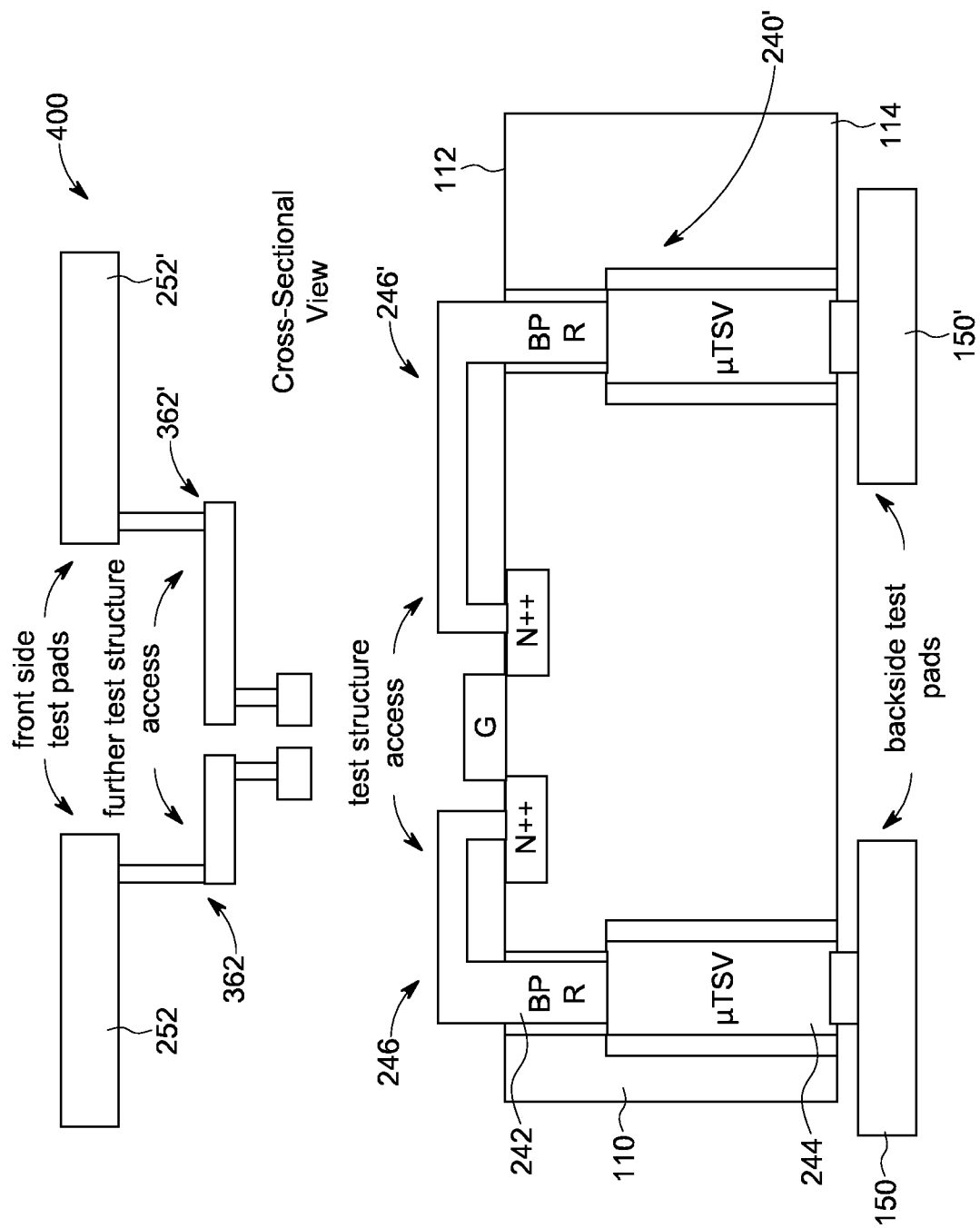
FIG. 4 shows a cross-sectional view of another example of a semiconductor structure.

FIG. 4 shows a cross-sectional view of another example of a semiconductor structure 400. The semiconductor structure 400 comprises a plurality of transistors (not shown) located at a front side 112 of the semiconductor substrate 110. Further, the semiconductor structure 400 comprises a test structure, which may comprise a first terminal and a second terminal, and a further test structure (not shown), which may comprise a first terminal and a second terminal.

Further, the semiconductor structure 400 comprises a first electrically conductive connection 240 and a fourth electrically conductive connection 240' extending from the first terminal 222 or the second terminal 224 to a backside test pad 150 or a further backside test pad 150', respectively. For example, the first electrically conductive connection 240 may comprise a BPR 242 and a μTSV 244. For example, the fourth electrically conductive connection 240' may comprise a BPR and a μTSV. Further, the first electrically conductive connection 240 and/or the fourth electrically conductive connection 240' may comprise a portion located in a front-end-of-line layer 246/246' located on top of the semiconductor substrate 110. For example, the first electrically conductive connection 240 and the fourth electrically conductive connection 240' may be formed by the same process, e.g., by the process(es) for forming the BPR 242, the μTSV 244 and the front-end-of-line layer 246/246'. For example, the front-end-of-line layer 246 and the front-end-of-line layer 246' may be the same front-end-of-line layer formed by one process. Alternatively, the front-end-of-line layer 246 and the front-end-of-line layer 246' may be formed by different processes.

The semiconductor structure comprises a wiring layer stack (not shown entirely), which may comprise an intermediate layer. Test structure and all backside test pads 150/150' connected to the test structure may be located at a first side of the intermediate layer, e.g., at a side facing the semiconductor substrate 110. The further test structure and all front side test pads 252/252' connected to the further test structure may be located at a second, opposite side of the intermediate layer, e.g., on a side facing away from the semiconductor substrate 110.

A front side test pad 252 may be electrically connected by a second electrically conductive connection to the further test structure. A further front side test pad 252' may be electrically connected by a third electrically conductive connection to the further test structure. For example, the second electrically conductive connection and the third electrically conductive connection 240' may be formed by the same process, e.g., by the process(es) for forming the front side wiring layer stack 362/362'. For example, a portion of the second electrically conductive connection may be located in the front side wiring layer stack 362. For example, a portion of the third electrically conductive connection may be located in the front side wiring layer stack 362'. This way, the second/third electrically conductive connection can be formed simultaneously to/with a process for forming a functional front side wiring layer stack 362/362', which may decrease an effort for forming/connecting the test structure 220. For example, the front side wiring layer stack 362 and the front side wiring layer stack 362' may be the same front side wiring layer stack formed by one process. Alternatively, the front side wiring layer stack 362 and the front side wiring layer stack 362' may be formed by different processes.

The test structure can be monitored/tested by the test structure access 246/246' from the backside 114 of the semiconductor substrate 110 using the backside test pads 150/150'. The further test structure may laterally overlap with the text structure and thus the front side test pads 252/252' may laterally overlap with backside test pads 150/150'.

As can be seen in FIG. 4 an area for arranging test pads can be efficiently used. For example, area-efficient stacking of test structures, e.g., monitoring structures such like the test structure and the further test structure, with contacts wired to front side and back side of the chip, respectively can be performed.

In principle, for process monitoring, there is a large variety of necessary test structures to monitor/test for any changes within FEOL or BEOL. An area needed for forming different test structures can be decreased by different device layers, which may not share any device layers, on top of each other (by stacking). Further, each device layer can be contacted independently either form the top using the front side test pads 252/252' or from the bottom using the back side test pads 150/150'. This may lead to a significant reduction in area needed for a plurality of test structures and/or may allow to place much more test structures on the same area, which may extend a set of monitoring structures, leading to a higher level of detail regarding the monitoring data, e.g., increasing a monitoring data set.

Examples for test structures can be BEOL devices like MOM capacitors, MIM capacitors, metal resistance monitors on top of FEOL monitors such as NWell or PWell resistances, poly resistances, BEOL devices in lower metal layers, etc.

More details and aspects are mentioned in connection with the examples described above and/or below. The example shown in FIG. 4 may comprise one or more optional additional features corresponding to one or more aspects mentioned in connection with the proposed concept or one or more examples describe above (e.g., FIG. 1-3) and/or below (e.g., FIG. 5-7).

FIG. 5 shows different uses cases for the semiconductor structure. FIG. 5a shows a setup for monitoring/testing a test structure 520 by accessing at different contact planes, namely FEOL and BEOL. The FEOL can be accessed by a first electrically conductive connection 540 and a fourth electrically conductive connection 540'. The first electrically conductive connection 540 and a fourth electrically conductive connection 540' may comprise a portion of a front-end-of-line layer, a BPR and optionally a μTSV. The BEOL can be accessed by a second electrically conductive connection 552 and a third electrically conductive connection 552'. The second electrically conductive connection 552 and the third electrically conductive connection 552' may comprise a FEOL structure, e.g., a structure formed simultaneously with the test structure and a fully processed BEOL for contacting the test structure and/or transistors formed at the semiconductor substrate.

Figure 5A:
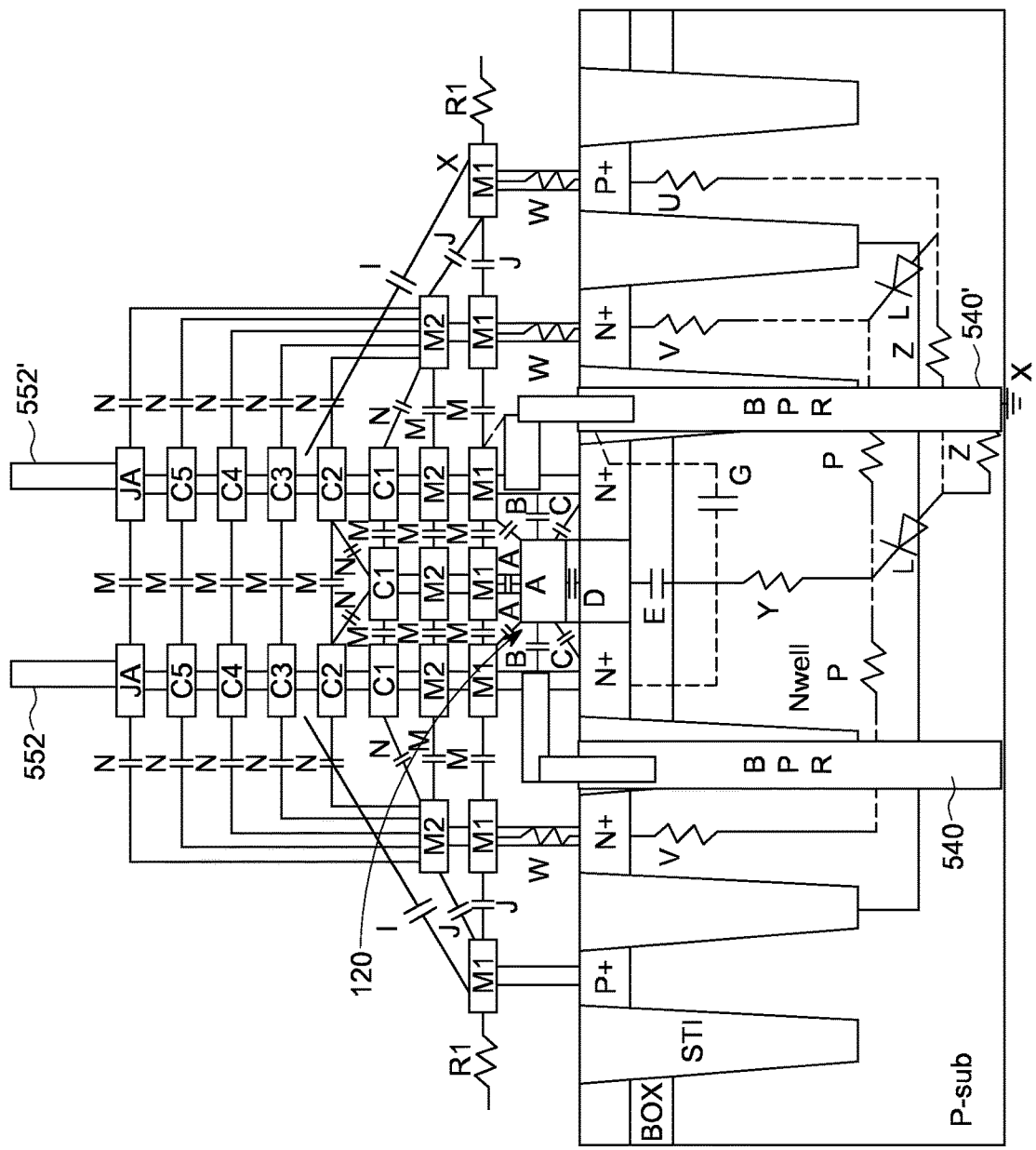
FIG. 5a-5c show different uses cases for the semiconductor structure.
Figure 5B:
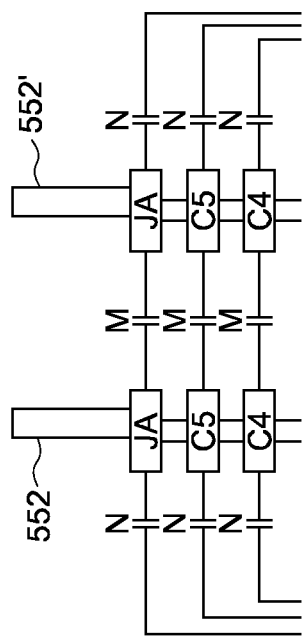
Figure 5B:
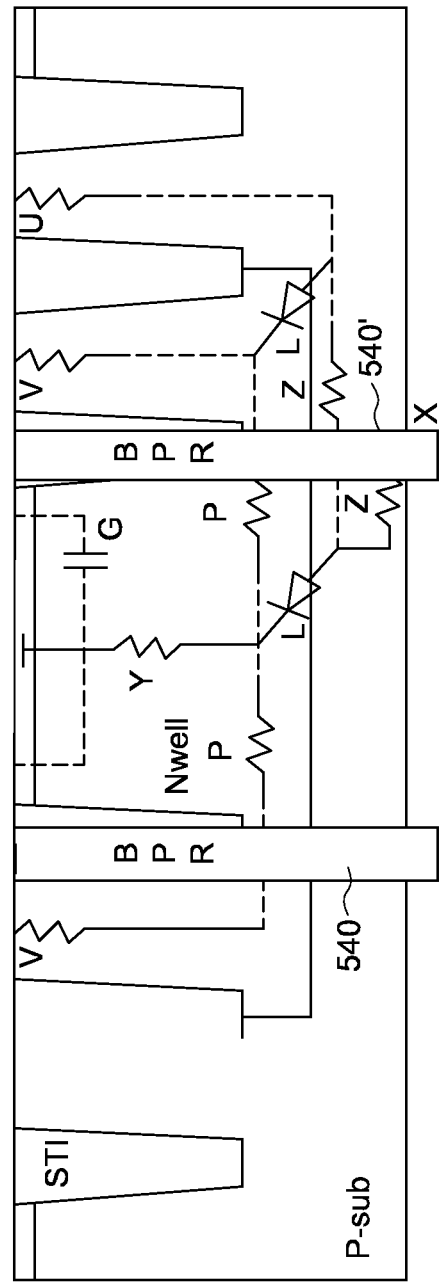

FIG. 5b shows a stacked setup comprising a test structure (not shown) and a further test structure (not shown). Each test structure can be monitored/tested by a first electrically conductive connection 540 and a fourth electrically conductive connection 540' or a second electrically conductive connection 552 and a third electrically conductive connection 552', respectively. Thus, FEOL and BEOL test structures can be combined on the same area of the semiconductor substrate. For example, the second electrically conductive connection 552 and the third electrically conductive connection 552' can be used to perform a BEOL test structure test, e.g., a capacitor, a thin film resistor, etc. For example, the first electrically conductive connection 540 and the third electrically conductive connection 540' can be used to perform a FEOL test structure test, e.g., NWell or PWell resistances, poly resistances, etc.

Figure 5C:
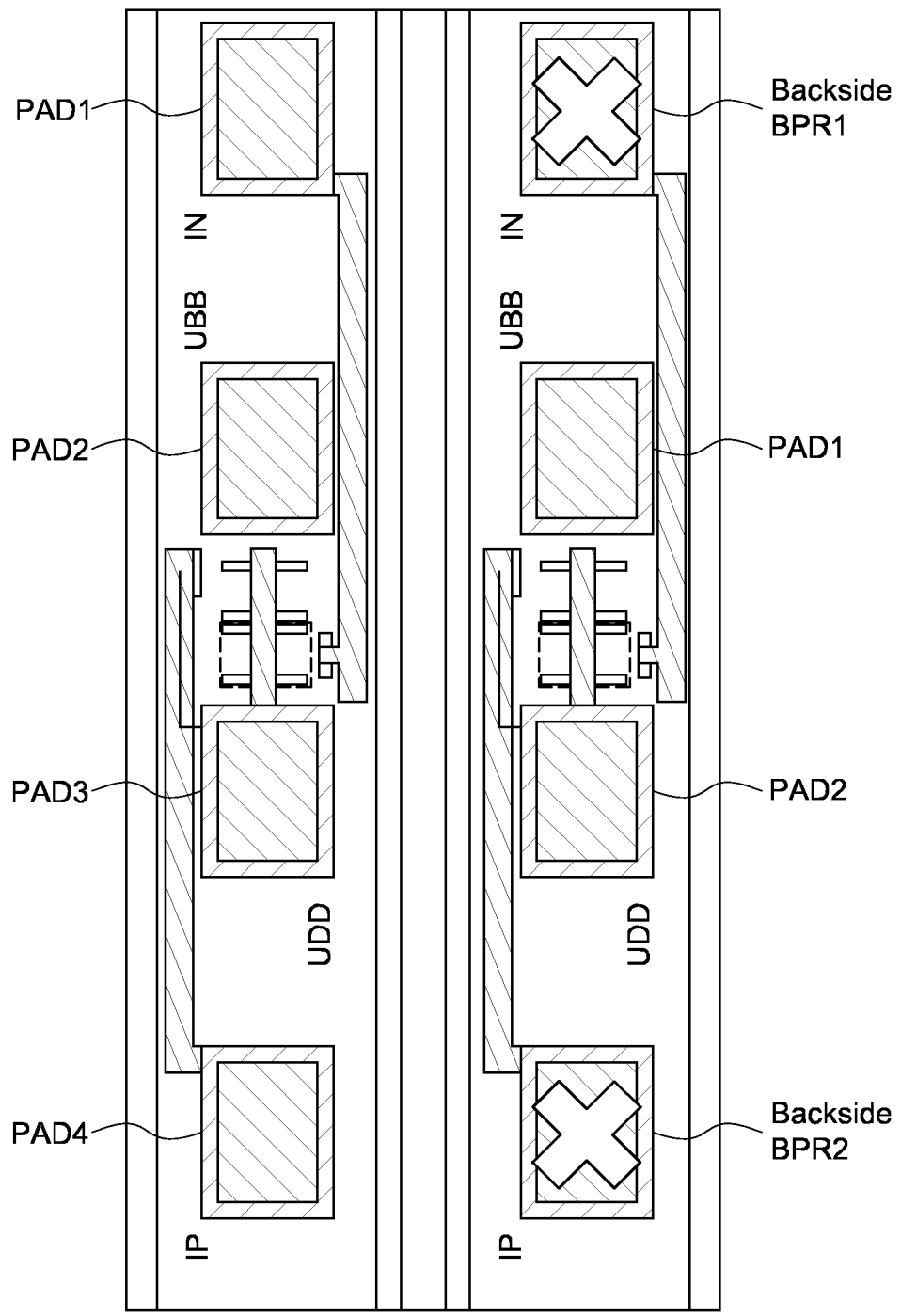

FIG. 5c shows an advantageously distribution of test pads using a semiconductor structure as described herein. As can be seen in the comparison between the left side (only front side test pads) and the right side (both front side test pads in the middle and backside test pads on top and bottom) an area saving of approximately 50% can be achieved by overlapping test pads arranged at opposing sides of the semiconductor substrate. For example, the area above the backside BPR1 can be used for another front side test pad, increasing the density of test pads arranged on the area.

More details and aspects are mentioned in connection with the examples described above and/or below. The example shown in FIG. 5 may comprise one or more optional additional features corresponding to one or more aspects mentioned in connection with the proposed concept or one or more examples describe above (e.g., FIG. 1-4) and/or below (e.g., FIG. 6-7).

Figure 6:
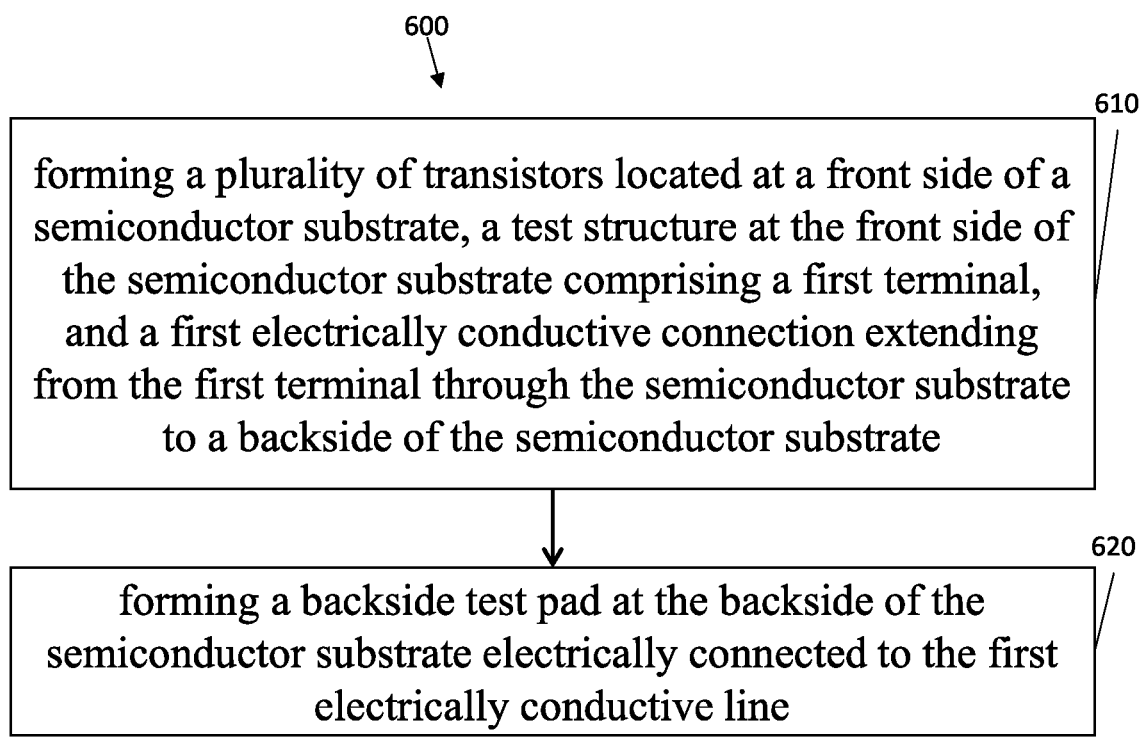
FIG. 6 shows an example of a method for forming a semiconductor structure.

FIG. 6 shows an example of a method 600 for forming a semiconductor structure. The method 600 comprises forming 610 a plurality of transistors located at a front side of a semiconductor substrate, a test structure at the front side of the semiconductor substrate comprising a first terminal, and a first electrically conductive connection extending from the first terminal through the semiconductor substrate to a backside of the semiconductor substrate. Further, the method comprises forming 620 a backside test pad at the backside of the semiconductor substrate electrically connected to the first electrically conductive connection. For example, the method 600 may be used to form a semiconductor structure as described above, e.g., with reference to FIG. 1.

In an example, the method 600 may further comprise forming the first electrically conductive connection comprises forming a trench extending into the semiconductor substrate and forming a buried line in the trench. This way, the first electrically conductive connection can be formed in an eased way, e.g., simultaneously with BPR for powering the plurality of transistors.

In an example, forming the test structure further may comprises forming a second terminal of the test structure. Further, the method 600 may comprise forming a second electrically conductive connection extending from the second terminal to a front side of the semiconductor substrate and forming a front side test pad at the front side of the semiconductor substrate electrically connected to the second electrically conductive connection. In an example, the front side test pad may be arranged such that from a top view the front side test pad overlaps with the backside test pad. This way, an area needed to arrange a plurality of test pads can be decreased.

More details and aspects are mentioned in connection with the examples described above and/or below. The example shown in FIG. 6 may comprise one or more optional additional features corresponding to one or more aspects mentioned in connection with the proposed concept or one or more examples describe above (e.g., FIG. 1-5) and/or below (e.g., FIG. 7).

Figure 7:
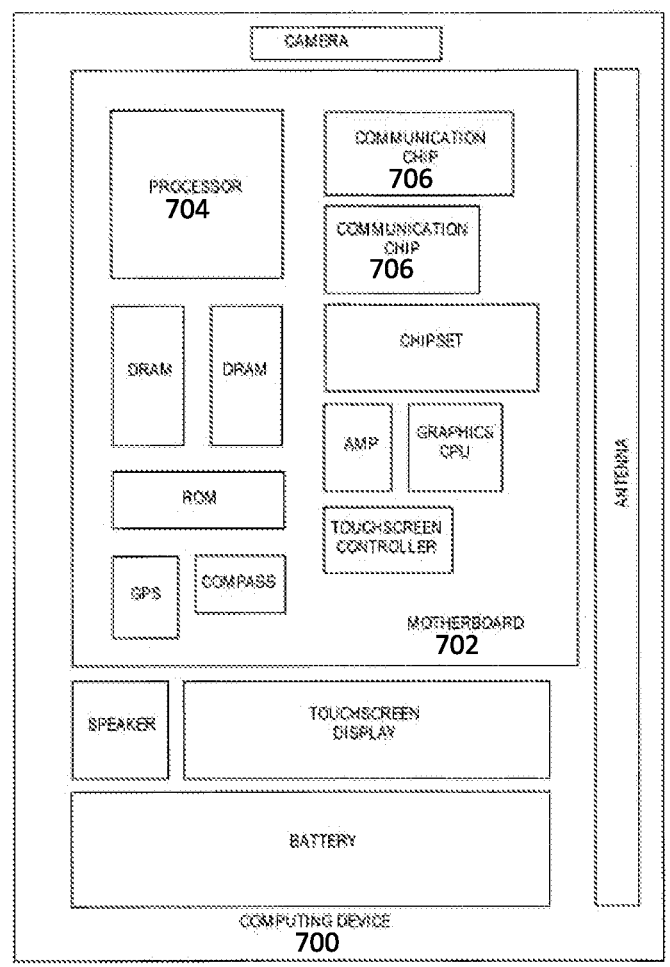
FIG. 7 shows a computing device.

Some examples relate to an electronic device comprising a semiconductor structure as described above. FIG. 7 shows a computing device 700. The computing device 700 houses a board 702. The board 702 may include a number of components, including but not limited to a processor 704 and at least one communication chip 706. A semiconductor structure as described above (e.g., with reference to FIG. 1-5) may be formed on the same semiconductor wafer as the processor 704, the graphics CPU or a memory device as shown in FIG. 7. Thus, the semiconductor structure could be used during the manufacturing to monitor a specific process of the manufacturing and hence to monitor the manufacturing of the processor 704, the graphics CPU or the memory device. For example, the semiconductor structure as described above (e.g., with reference to FIG. 1-5) may be a die, e.g. a die of the processor 704, the graphics CPU or a memory device as shown in FIG. 7.

The processor 704 is physically and electrically coupled to the board 702. In some examples the at least one communication chip 706 is also physically and electrically coupled to the board 702. In further examples, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some examples they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some examples, the integrated circuit die of the processor includes one or more devices that are assembled in an ePLB or eWLB based POP package that that includes a mold layer directly contacting a substrate, in accordance with examples. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another example, the integrated circuit die of the communication chip includes one or more devices that are assembled in an ePLB or eWLB based POP package that that includes a mold layer directly contacting a substrate, in accordance with examples.

More details and aspects are mentioned in connection with the examples described above. The example shown in FIG. 7 may comprise one or more optional additional features corresponding to one or more aspects mentioned in connection with the proposed concept or one or more examples described above (e.g., FIG. 1-6).

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

An example (e.g., example 1) relates to semiconductor structure (100), comprising a plurality of transistors (133) located at a front side (112) of a semiconductor substrate (110), a test structure (120) located at the front side (112) of the semiconductor substrate (110) and a first electrically conductive connection (140) extending from the test structure (122) through the semiconductor substrate (110) to a backside test pad (150) arranged at a backside (114) of the semiconductor substrate (110).

Another example (e.g., example 2) relates to a previously described example (e.g., example 1) wherein the first electrically conductive connection comprises at least a part of a buried line arranged in a trench extending into the semiconductor substrate.

Another example (e.g., example 3) relates to a previously described example (e.g., the example 2) wherein the first electrically conductive connection comprises a through semiconductor via extending from the backside of the semiconductor substrate to the buried line.

Another example (e.g., example 4) relates to a previously described example (e.g., one of the examples 1-3) wherein the first electrically conductive connection comprises a portion located in a front-end-of-line layer located on top of the semiconductor substrate.

Another example (e.g., example 5) relates to a previously described example (e.g., one of the examples 1-4) wherein the semiconductor structure is a semiconductor wafer or a semiconductor die.

Another example (e.g., example 6) relates to a previously described example (e.g., one of the examples 1-5) wherein the semiconductor structure is a semiconductor wafer and wherein the test structure is located in a kerf region of the semiconductor wafer.

Another example (e.g., example 7) relates to a previously described example (e.g., one of the examples 1-6) wherein a maximal dimension of the backside test pad is at most 100 µm and at least 10 µm.

Another example (e.g., example 8) relates to a previously described example (e.g., one of the examples 1-7) wherein the test structure comprises at least one element of the group of a transistor, a resistor, a diode, a capacitor, a metal layer and a via.

Another example (e.g., example 9) relates to a previously described example (e.g., one of the examples 1-8) wherein the test structure comprises a first terminal and a second terminal, wherein the first electrically conductive connection is connected to the first terminal, wherein a second electrically conductive connection extends from the second terminal to a front side test pad arranged at the front side of the semiconductor substrate.

Another example (e.g., example 10) relates to a previously described example (e.g., the example 9) wherein a third electrically conductive connection extends from the first terminal to a further front side test pad arranged at the front side of the semiconductor substrate.

Another example (e.g., example 11) relates to a previously described example (e.g., one of the examples 9-10) wherein a fourth electrically conductive connection extends from the second terminal through the semiconductor substrate to a further backside test pad arranged at the backside of the semiconductor substrate.

Another example (e.g., example 12) relates to a previously described example (e.g., one of the examples 1-8) further comprising a further test structure arranged at the front side of the semiconductor substrate and a second electrically conductive connection extending from the further test structure to a front side test pad arranged at the front side of the semiconductor substrate.

Another example (e.g., example 13) relates to a previously described example (e.g., one of the examples 9-12) wherein the second electrically conductive connection comprises a portion located in a front side wiring layer stack formed on the front side of the semiconductor substrate.

Another example (e.g., example 14) relates to a previously described example (e.g., one of the examples 9-13) wherein the front side test pad laterally overlaps with the backside test pad.

Another example (e.g., example 15) relates to a previously described example (e.g., one of the examples 12-14) wherein a third electrically conductive connection extends from the further test structure to a further front side test pad arranged at the front side of the semiconductor substrate.

Another example (e.g., example 16) relates to a previously described example (e.g., one of the examples 10, 11 or 15) wherein the third electrically conductive connection comprises a portion located in a front side wiring layer stack formed on the front side of the semiconductor substrate.

Another example (e.g., example 17) relates to a previously described example (e.g., one of the examples 12-16) wherein the test structure comprises a first terminal and a second terminal, wherein the first electrically conductive connection is connected to the first terminal, wherein a fourth electrically conductive connection extends from the second terminal of the test structure through the semiconductor substrate to a further backside test pad arranged at the backside of the semiconductor substrate.

Another example (e.g., example 18) relates to relates to a previously described example (e.g., one of the examples 11 or 17) wherein the fourth electrically conductive connection comprises at least a part of a buried line arranged in a trench extending into the semiconductor substrate.

Another example (e.g., example 19) relates to a previously described example (e.g., the example 18) wherein the fourth electrically conductive connection comprises a through semiconductor via extending from the backside of the semiconductor substrate to the buried line.

Another example (e.g., example 20) relates to a previously described example (e.g., one of the examples 11, 17-19) wherein the further front side test pad laterally overlaps with the further backside test pad.

Another example (e.g., example 21) relates to a previously described example (e.g., one of the examples 12-20) wherein a wiring layer stack comprises an intermediate layer, wherein the test structure and all backside test pads connected to the test structure are located at a first side of the intermediate layer, and wherein the further test structure and all front side test pads connected to the further test structure are located at a second, opposite side of the intermediate layer.

An example (e.g., example 22) relates to method for forming a semiconductor structure comprising forming a plurality of transistors located at a front side of a semiconductor substrate, a test structure at the front side of the semiconductor substrate and a first electrically conductive connection extending from the test structure through the semiconductor substrate to a backside of the semiconductor substrate and forming a backside test pad at the backside of the semiconductor substrate electrically connected to the first electrically conductive connection.

Another example (e.g., example 23) relates to a previously described example (e.g., the example 22) wherein forming the first electrically conductive connection comprises forming a trench extending into the semiconductor substrate and forming a buried line in the trench.

Another example (e.g., example 24) relates to a previously described example (e.g., one of the examples 22-23) wherein forming the test structure further comprises forming a second terminal of the test structure, further comprising forming a second electrically conductive connection extending from the second terminal to a front side of the semiconductor substrate and forming a front side test pad at the front side of the semiconductor substrate electrically connected to the second electrically conductive line.

Another example (e.g., example 25) relates to a previously described example (e.g., the example 24) wherein the front side test pad is arranged such that from a top view the front side test pad overlaps with the backside test pad.

An example (e.g., example 26) relates to an electronic device comprising a semiconductor structure as described above (e.g., described with reference to one of the examples 1-21).

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A semiconductor structure, comprising:
   a plurality of transistors located at a front side of a semiconductor substrate;
   a test structure located at the front side of the semiconductor substrate;
   a first electrically conductive connection extending from the test structure through the semiconductor substrate to a backside test pad arranged at a backside of the semiconductor substrate.

2. The semiconductor structure according to claim 1, wherein
   the first electrically conductive connection comprises at least a part of a buried line arranged in a trench extending into the semiconductor substrate.

3. The semiconductor structure according to claim 2, wherein
   the first electrically conductive connection comprises a through semiconductor via extending from the backside of the semiconductor substrate to the buried line.

4. The semiconductor structure according to claim 1, wherein
   the first electrically conductive connection comprises a portion located in a front-end-of-line layer located on top of the semiconductor substrate.

5. The semiconductor structure according to claim 1, wherein
   the semiconductor structure is a semiconductor wafer or a semiconductor die.

6. The semiconductor structure according to claim 1, wherein
   the semiconductor structure is a semiconductor wafer and wherein the test structure is located in a kerf region of the semiconductor wafer.

7. The semiconductor structure according to claim 1, wherein
   a maximal dimension of the backside test pad is at most 100 μm and at least 10 μm.

8. The semiconductor structure according to claim 1, wherein
   the test structure comprises at least one element of the group of:
   a transistor;
   a resistor;
   a diode;
   a capacitor;
   a metal layer; and
   a via.

9. The semiconductor structure according to claim 1, wherein:
   the test structure comprises a first terminal and a second terminal, wherein the first electrically conductive connection is connected to the first terminal, wherein a second electrically conductive connection extends from the second terminal to a front side test pad arranged at the front side of the semiconductor substrate.

10. The semiconductor structure according to claim 9, wherein
    a third electrically conductive connection extends from the first terminal to a further front side test pad arranged at the front side of the semiconductor substrate.

11. The semiconductor structure according to claim 9, wherein
    a fourth electrically conductive connection extends from the second terminal through the semiconductor substrate to a further backside test pad arranged at the backside of the semiconductor substrate.

12. The semiconductor structure according to claim 1, further comprising:
    a further test structure arranged at the front side of the semiconductor substrate; and
    a second electrically conductive connection extending from the further test structure to a front side test pad arranged at the front side of the semiconductor substrate.

13. The semiconductor structure according to claim 9, wherein
    the second electrically conductive connection comprises a portion located in a front side wiring layer stack formed on the front side of the semiconductor substrate.

14. The semiconductor structure according to claim 9, wherein
    the front side test pad laterally overlaps with the backside test pad.

15. The semiconductor structure according to claim 12, wherein
a third electrically conductive connection extends from the further test structure to a further front side test pad arranged at the front side of the semiconductor substrate.

16. The semiconductor structure according to claim 10, wherein
the third electrically conductive connection comprises a portion located in a front side wiring layer stack formed on the front side of the semiconductor substrate.

17. The semiconductor structure according to claim 12, wherein
the test structure comprises a first terminal and a second terminal, wherein the first electrically conductive connection is connected to the first terminal, wherein
a fourth electrically conductive connection extends from the second terminal of the test structure through the semiconductor substrate to a further backside test pad arranged at the backside of the semiconductor substrate.

18. The semiconductor structure according to claim 11, wherein
the fourth electrically conductive connection comprises at least a part of a buried line arranged in a trench extending into the semiconductor substrate.

19. The semiconductor structure according to claim 18, wherein
the fourth electrically conductive connection comprises a through semiconductor via extending from the backside of the semiconductor substrate to the buried line.

20. The semiconductor structure according to claim 11, wherein
the further front side test pad laterally overlaps with the further backside test pad.

21. The semiconductor structure according to claim 12, wherein
a wiring layer stack comprises an intermediate layer, wherein the test structure and all backside test pads connected to the test structure are located at a first side of the intermediate layer, and wherein the further test structure and all front side test pads connected to the further test structure are located at a second, opposite side of the intermediate layer.

22. A method for forming a semiconductor structure, comprising:
forming a plurality of transistors located at a front side of a semiconductor substrate, a test structure at the front side of the semiconductor substrate, and a first electrically conductive connection extending from the test structure through the semiconductor substrate to a backside of the semiconductor substrate; and
forming a backside test pad at the backside of the semiconductor substrate electrically connected to the first electrically conductive connection.

23. The method according to claim 22, wherein
forming the first electrically conductive connection comprises forming a trench extending into the semiconductor substrate and forming a buried line in the trench.

24. An electronic device comprising a semiconductor structure, comprising:
a plurality of transistors located at a front side of a semiconductor substrate;
a test structure located at the front side of the semiconductor substrate;
a first electrically conductive connection extending from the test structure through the semiconductor substrate to a backside test pad arranged at a backside of the semiconductor substrate.

* * * * *